US012648494B2

(12) United States Patent
Tseng et al.

(10) Patent No.: US 12,648,494 B2
(45) Date of Patent: Jun. 2, 2026

(54) LIGHT EMITTING COMPONENT ARRAY SUBSTRATE

(71) Applicant: AUO Corporation, Hsin-Chu (TW)

(72) Inventors: Wen-Hsien Tseng, Hsin-Chu (TW); Chia-Hui Pai, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 406 days.

(21) Appl. No.: 18/399,910

(22) Filed: Dec. 29, 2023

(65) Prior Publication Data

US 2025/0079408 A1     Mar. 6, 2025

(30) Foreign Application Priority Data

Aug. 28, 2023    (TW) ................................. 112132277

(51) Int. Cl.
    *H01L 25/075*     (2006.01)
    *H10W 90/00*     (2026.01)
(52) U.S. Cl.
    CPC ................................... *H10W 90/00* (2026.01)
(58) Field of Classification Search
    CPC ..... H10W 90/00; H10H 20/01; H10H 20/018; H10P 72/7402

USPC ........................................................... 257/79
See application file for complete search history.

(56) References Cited

U.S. PATENT DOCUMENTS

2022/0238767 A1*   7/2022   Dohner ................. H10H 20/01
2023/0317498 A1   10/2023   Chen et al.

* cited by examiner

*Primary Examiner* — Tong-Ho Kim
(74) *Attorney, Agent, or Firm* — Tim Tingkang Xia, Esq.; Troutman Pepper Locke LLP

(57) ABSTRACT

A light emitting component array substrate includes a temporary storage substrate, a plurality of light emitting components, a plurality of first adhering patterns and a plurality of second adhering patterns. The light emitting components are disposed on the temporary storage substrate. The first adhering patterns and the second adhering patterns are respectively disposed on the light emitting components. A transmittance of each of the first adhering patterns at an operating wavelength is different from a transmittance of at least one portion of each of the second adhering patterns at the operating wavelength, or an adhesion of each of the first adhering patterns at an operating temperature is different from an adhesion of at least one portion of each of the second adhering patterns at the operating temperature.

9 Claims, 11 Drawing Sheets

LIGHT EMITTING COMPONENT ARRAY SUBSTRATE

CROSS-REFERENCE TO RELATED PATENT APPLICATION

This non-provisional application claims priority to and the benefit of, pursuant to 35 U.S.C. § 119(a), patent application Serial No. 112132277 filed in Taiwan on Aug. 28, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to an array substrate, and particularly to a light emitting component array substrate.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A light emitting diode (LED) display panel includes a driving backplane and a plurality of LED components transposed on the driving backplane. Inheriting the characteristics of the LED, the LED display panel has the advantages such as saving power, high efficiency, high brightness and fast response time. In addition, compared to the organic LED (OLED) display panel, the LED display panel further has the advantages such as easy color adjustment, long luminous life and no image burn-in. Thus, the LED display panel are considered the next generation of display technology.

In the manufacturing process of the LED display panel, the LED components on a growth substrate needs to be transferred to a first temporary storage substrate, and the LED components on the first temporary storage substrate are then transferred to and rearranged on a second temporary storage substrate. Subsequently, the LED components on the second temporary storage substrate may be transferred to the driving backplane to complete the LED display panel. However, limited by the process accuracy, the arranging density of the LED components on the first and second temporary storage substrates cannot be further reduced, resulting in the manufacturing cost of the LED display panel remaining high.

SUMMARY

The present disclosure provides a light emitting component array substrate, which helps reduce the cost.

The light emitting component array substrate according to certain embodiments of the present disclosure includes a temporary storage substrate, a plurality of light emitting components, a plurality of first adhering patterns and a plurality of second adhering patterns. The light emitting components are disposed on the temporary storage substrate. The first adhering patterns and the second adhering patterns are respectively disposed on the light emitting components. A transmittance of each of the first adhering patterns at an operating wavelength is different from a transmittance of at least one portion of each of the second adhering patterns at the operating wavelength, or an adhesion of each of the first adhering patterns at an operating temperature is different from an adhesion of at least one portion of each of the second adhering patterns at the operating temperature.

These and other aspects of the present disclosure will become apparent from the following description of the embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1A:
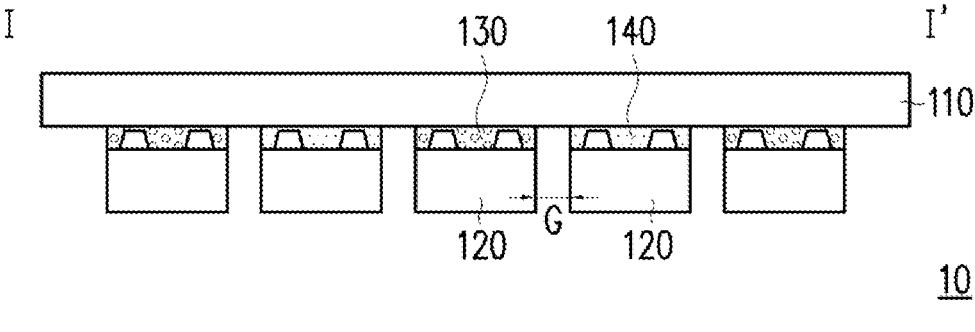
FIG. 1A to FIG. 1D are sectional schematic views of a manufacturing process of a light emitting component array substrate according to one embodiment of the present disclosure.

The present disclosure will now be described hereinafter in details with reference to the accompanying drawings, in which exemplary embodiments of the disclosure are shown. Whenever possible, identical reference numerals refer to identical or like elements in the drawings and descriptions.

It should be understood that when one component such as a layer, a film, a region or a substrate is referred to as being disposed "on" the other component or "connected to" the other component, the component may be directly disposed on the other component or connected to the other component, or an intermediate component may also exist between the two components. In contrast, when one component is referred to as being "directly disposed on the other component" or "directly connected to" the other component, no intermediate component exists therebetween. As used herein, a "connection" may be a physical and/or electrical connection. In addition, when two components are "electrically connected" or "coupled", other components may exist between the two components.

The terms "about", "approximately" or "substantially" as used herein shall cover the values described, and cover an average value of an acceptable deviation range of the specific values ascertained by one of ordinary skill in the art, where the deviation range may be determined by the measurement described and specific quantities of errors related to the measurement (that is, the limitations of the measuring system). For example, the term "about" represents within one or more standard deviations of a given value of range, such as within ±30 percent, within ±20 percent, within ±10 percent or within ±5 percent. Moreover, the terms "about", "approximately" or "substantially" as used herein may selectively refer to a more acceptable deviation range or the standard deviation based on the optical characteristics, the etching characteristic or other characteristics, without applying one standard deviation to all characteristics.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1A to FIG. 1D are sectional schematic views of a manufacturing process of a light emitting component array substrate according to one embodiment of the present disclosure. FIG. 2 is a top and perspective schematic view of a temporary storage substrate, a plurality of first adhering patterns and a plurality of second adhering patterns according to one embodiment of the present disclosure. FIG. 1A corresponds to the sectional line I-I' of FIG. 2.

Referring to FIG. 1A, firstly, a light emitting array substrate 10 is provided. The light emitting array substrate 10 includes a temporary storage substrate 110, a plurality of light emitting components 120, a plurality of first adhering patterns 130 and a plurality of second adhering patterns 140. The light emitting components 120 are disposed on the temporary storage substrate 110. The first adhering patterns 130 and the second adhering patterns 140 are respectively disposed on the light emitting components 120. In one embodiment, the first adhering patterns 130 and the second adhering patterns 140 may be located between the temporary storage substrate 110 and the light emitting components 120, and each light emitting component 120 may be temporarily fixed on the temporary storage substrate 110 by a corresponding first adhering pattern 130 or a corresponding second adhering pattern 140, but the present disclosure is not limited thereto. In one embodiment, the light emitting components may be micro LEDs (μLEDs), but the present disclosure is not limited thereto.

Referring to FIG. 2, in one embodiment, a first direction d1 intersects with a second direction d2, and the first adhering patterns 130 and the second adhering patterns 140 are arranged alternately in the first direction d1 and the second direction d2. In short, in one embodiment, the first adhering patterns 130 and the second adhering patterns 140 may be arranged in a way similar to a chess board, but the present disclosure is not limited thereto.

Figure 3:
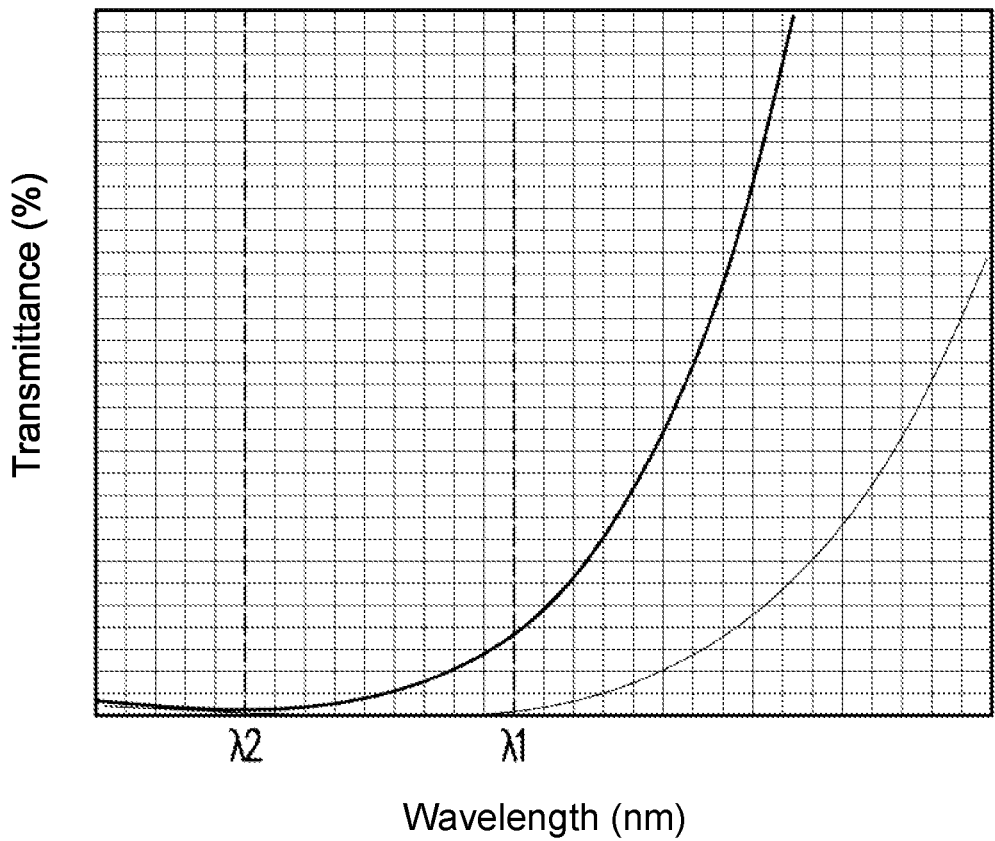
FIG. 3 shows the transmittances of the first adhering patterns 130 and the second adhering patterns 140 at each wavelength according to one embodiment of the present disclosure.

FIG. 3 shows the transmittances of the first adhering patterns 130 and the second adhering patterns 140 at each wavelength according to one embodiment of the present disclosure. Referring to FIG. 1A and FIG. 3, it should be noted that, in one embodiment, a transmittance of each first adhering pattern 130 at an operating wavelength 21 is different from a transmittance of at least one portion of each second adhering pattern 140 at the operating wavelength $\lambda 1$. For example, in one embodiment, the transmittance of each first adhering pattern 130 at the operating wavelength $\lambda 1$ is less than the transmittance of the at least one portion of each second adhering pattern 140 at the same operating wavelength $\lambda 1$. In other words, in one embodiment, at the same operating wavelength $\lambda 1$, the absorption of each first adhering pattern 130 is greater than the absorption of the at least one portion of each second adhering pattern 140. In one embodiment, preferably, the transmittance of each first adhering pattern 130 at the operating wavelength $\lambda 1$ is close to or equal to 0%. In other words, in one embodiment, preferably, the absorption of each first adhering pattern 130 at the operating wavelength $\lambda 1$ is close to or equal to 100%, but the present disclosure is not limited thereto.

In one embodiment, an absolute value of a difference between the transmittance of each first adhering pattern 130 at the operating wavelength $\lambda 1$ and the transmittance of the at least one portion of each second adhering pattern 140 at the operating wavelength $\lambda 1$ is greater than or equal to 10%, but the present disclosure is not limited thereto.

Referring to FIG. 1A, in one embodiment, a material of the whole second adhering patterns 140 is different from a material of the first adhering patterns 130. However, the present disclosure is not limited thereto, and in other embodiments, it is possible that a material of a portion of each of the second adhering patterns 140 is identical to the material of the first adhering patterns 130, and a material of another portion of each of the second adhering patterns 140 is different from the material of the first adhering patterns 130, which will be described using examples with other drawings in subsequent paragraphs.

Figure 1B:
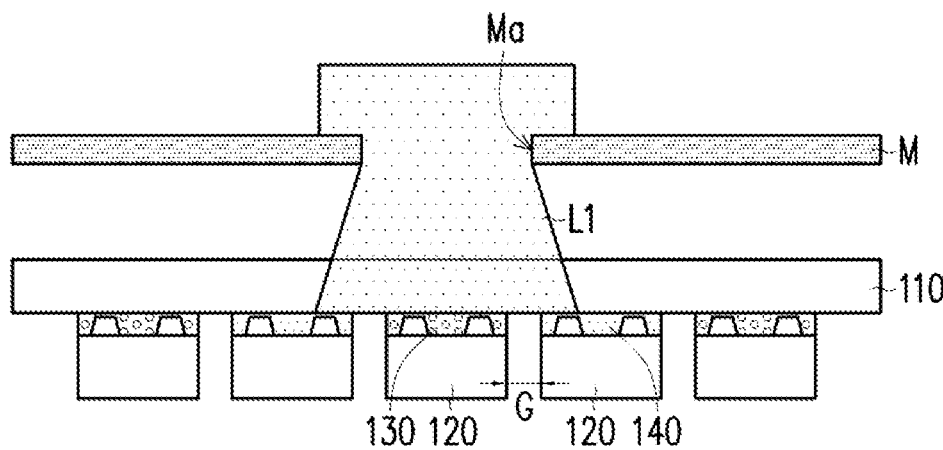
Figure 1C:
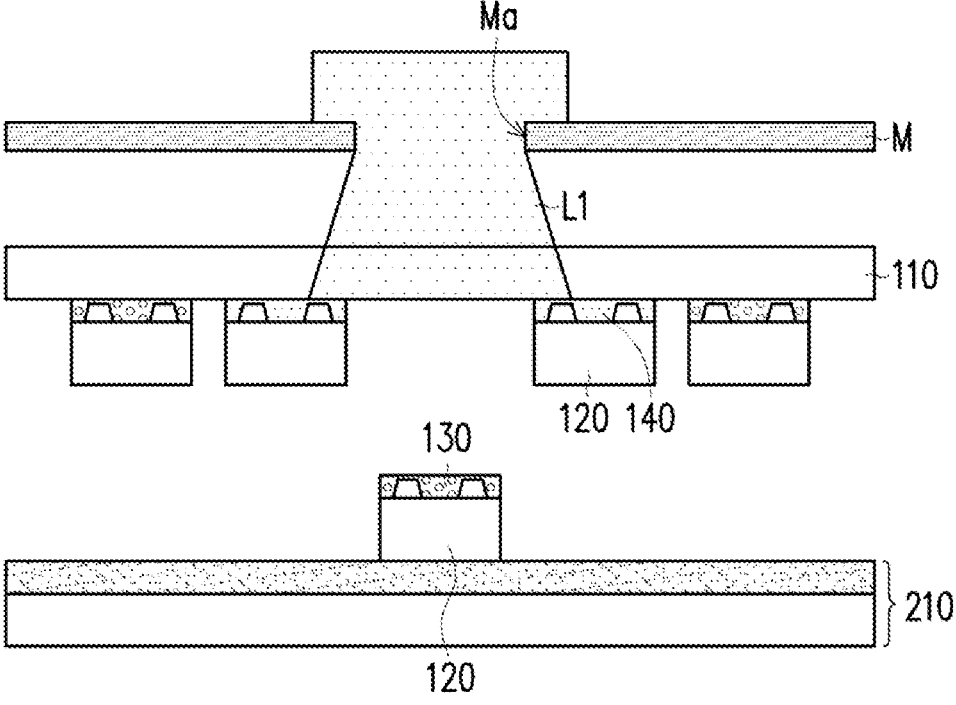
Figure 2:
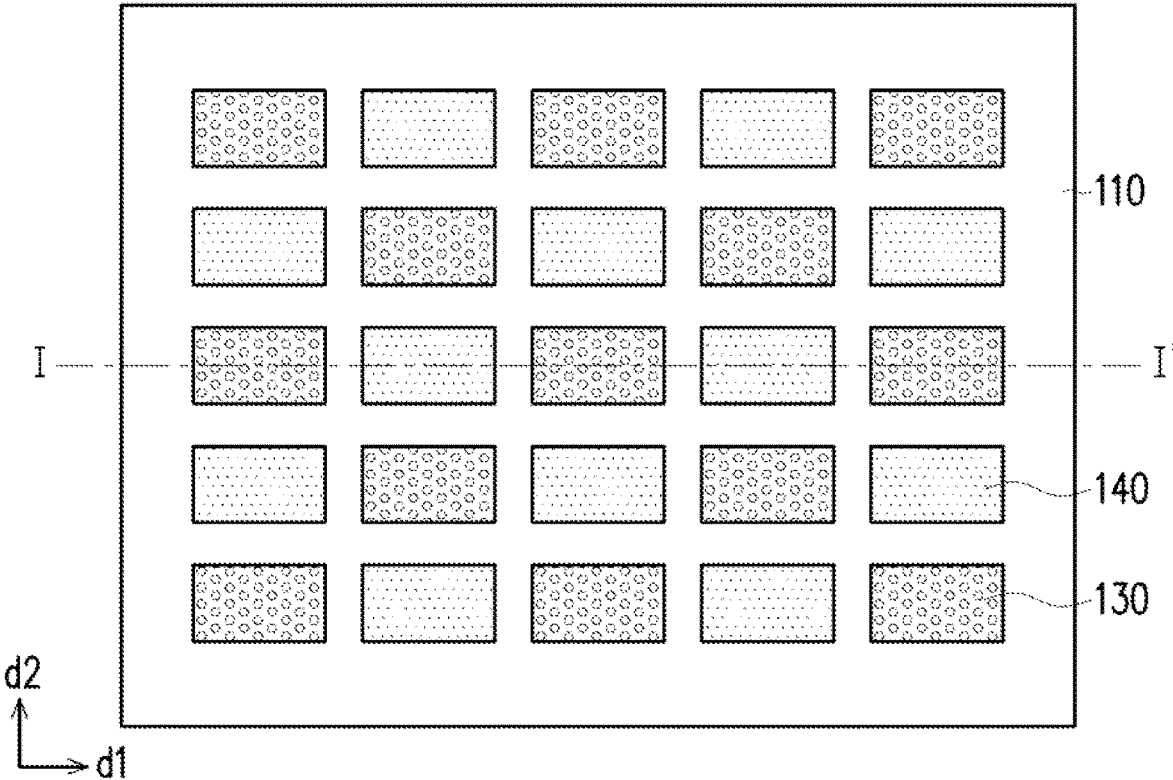
FIG. 2 is a top and perspective schematic view of a temporary storage substrate, a plurality of first adhering patterns and a plurality of second adhering patterns according to one embodiment of the present disclosure.

Referring to FIG. 1B and FIG. 1C, in one embodiment, subsequently, the first adhering patterns 130 are detached from the temporary storage substrate 110 optionally using the laser lift-off (LLO) technology, such that the first adhering patterns 130 and the light emitting components 120 connected to the first adhering patterns 130 are transposed to another temporary storage substrate 210. In detail, a laser beam L1 passes through a transparent region Ma of a mask M to illuminate the first adhering patterns 130 on the light emitting components 120 to be transferred, such that the first adhering patterns 130 are dissociated and detached from the temporary storage substrate 110, and the light emitting components 120 connected to the first adhering patterns 130 fall on another temporary storage substrate 210.

Referring to FIG. 1B, FIG. 1C and FIG. 3, it should be noted that, when detaching the first adhering patterns 130 from the temporary storage substrate 110 using the laser lift-off (LLO) process, a central wavelength of the laser beam L1 used to illuminate the first adhering patterns 130 is equal to or close to the operating wavelength λ1. Since the transmittance/absorptance of the first adhering patterns 130 at the operating wavelength λ1 are different from the transmittance/absorptance of the at least one portion of each of the second adhering patterns 140 at the operating wavelength λ1, when detaching the first adhering pattern 130 from the temporary substrate 110 using the laser beam L1, even though the laser beam L1 illuminates the adjacent second adhering patterns 140, the second adhering patterns 140 are not easily dissociated, and the light emitting components 120 connected to the second adhering patterns 140 are less likely being mistakenly transferred to another temporary storage substrate 210. Thus, when designing a gap G (referring to FIG. 1A) of the light emitting components 120 on the temporary substrate 110, the gap G may be properly reduced, thereby helping to reduce the cost.

Figure 1D:
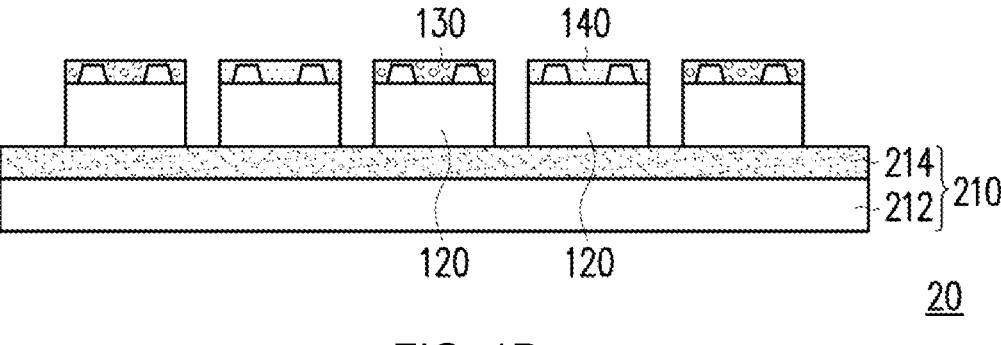

Referring to FIG. 1C and FIG. 1D, in one embodiment, subsequently, the second adhering patterns 140 are detached from the temporary storage substrate 110 optionally using the laser lift-off (LLO) technology, such that the second adhering patterns 140 and the light emitting components 120 connected to the second adhering patterns 140 are transposed to another temporary storage substrate 210, thereby completing another light emitting component array substrate 20.

Referring to FIG. 1C, FIG. 1D and FIG. 3, in one embodiment, when detaching the second adhering patterns 140 from the temporary storage substrate 110 using the LLO process, a central wavelength of another laser beam (not illustrated) used to illuminate the second adhering patterns 140 is equal to or close to an operating wavelength λ2 (illustrated in FIG. 3), where the operating wavelength λ2 is different from the operating wavelength λ1. In one embodiment, the operating wavelength λ2 may be less than the operating wavelength λ1, but the present disclosure is not limited thereto.

Referring to FIG. 1D, the light emitting array substrate 20 includes the temporary storage substrate 210, the light emitting components 120, the first adhering patterns 130 and the second adhering patterns 140. The light emitting components 120 are disposed on the temporary storage substrate 210. The first adhering patterns 130 and the second adhering patterns 140 are respectively disposed on the light emitting components 120. In one embodiment, the light emitting components 120 are located between the first adhering patterns 130 and the temporary storage substrate 210 and between the second adhering patterns 140 and the temporary storage substrate 210. The and the temporary storage substrate 210 includes a substrate 212 and an adhering layer 214 disposed on the substrate 212. The light emitting component 120 are disposed on the adhering layer 214, and the light emitting components 120 are located between the first adhering patterns 130 and the adhering layer 214 and between the second adhering patterns 140 and the adhering layer 214.

It should be noted that the following embodiments use the reference numerals and certain contents of the aforementioned embodiment, in which identical or similar components are identified by identical reference numerals, and descriptions of the identical technical contents will be omitted. The omitted descriptions may be referenced to in the aforementioned embodiment, and are not hereinafter reiterated in the following embodiments.

Figure 4:
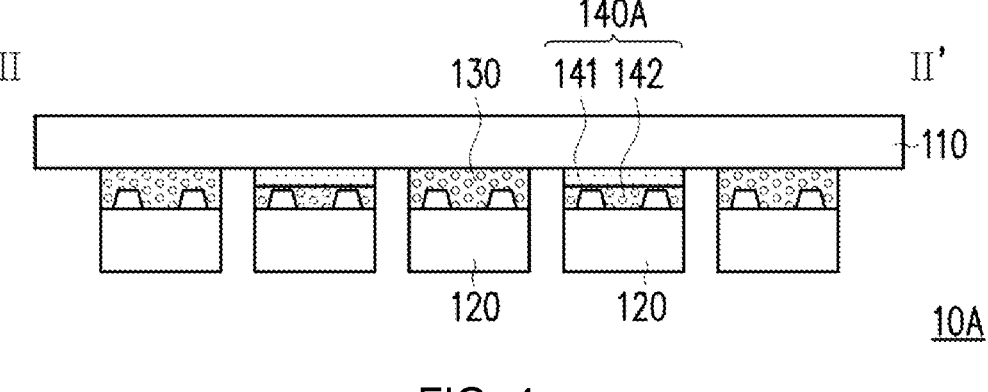
FIG. 4 is a sectional schematic view of a light emitting component array substrate according to another embodiment of the present disclosure.
Figure 5:
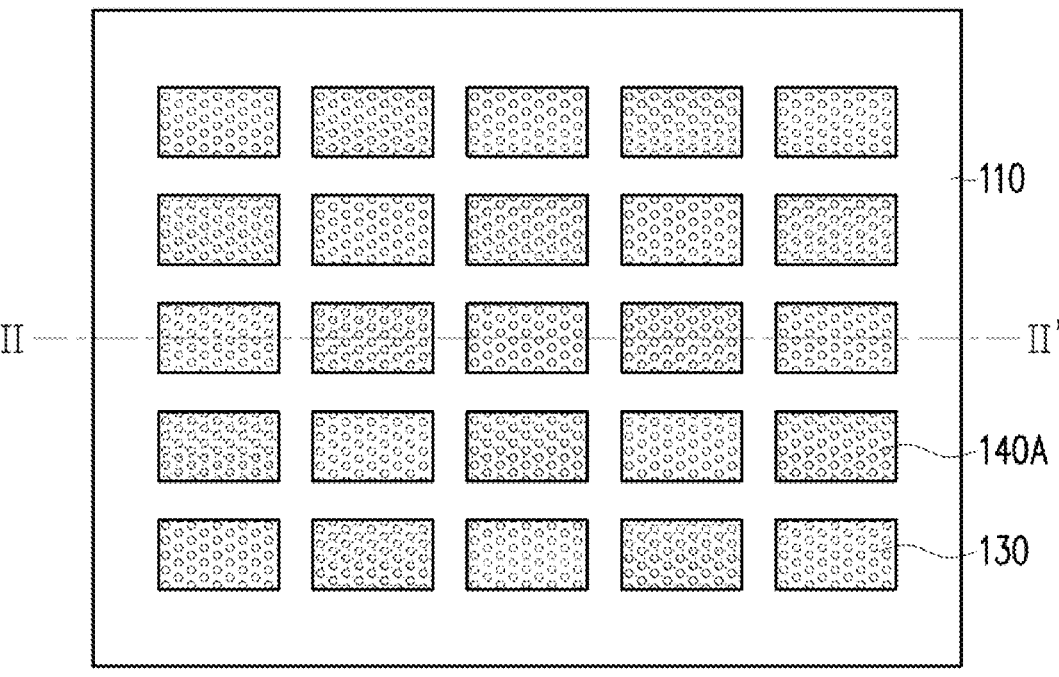
FIG. 5 is a top and perspective schematic view of a temporary storage substrate, a plurality of first adhering patterns and a plurality of second adhering patterns according to another embodiment of the present disclosure.

FIG. 4 is a sectional schematic view of a light emitting component array substrate according to another embodiment of the present disclosure. FIG. 5 is a top and perspective schematic view of a temporary storage substrate, a plurality of first adhering patterns and a plurality of second adhering patterns according to another embodiment of the present disclosure. FIG. 4 corresponds to the sectional line II-II' of FIG. 5. Referring to FIG. 4 and FIG. 5, the light emitting component array substrate 10A in the present embodiment is similar to the aforementioned light emitting component array substrate 10, and the difference between the two exists in that the second adhering patterns 140, 140A are different.

Referring to FIG. 4 and FIG. 5, specifically, in the present embodiment, each second adhering pattern 140A includes a first portion 141 and a second portion 142, and the second portion 142 of each second adhering pattern 140A is located between the first portion 141 of each second adhering pattern 140A and a corresponding light emitting component 120. The transmittance of the first portion 141 of each second adhering pattern 140A at the operating wavelength λ1 (referring to FIG. 3) is different from the transmittance of the first adhering patterns 130 at the same operating wavelength λ1. In one embodiment, the transmittance of the first adhering patterns 130 at the operating wavelength λ1 is less than the transmittance of the first portion 141 of each second adhering pattern 140A at the same operating wavelength λ1. The material of the second portion 142 of each second adhering pattern 140A may be identical to the material of the first adhering patterns 130.

FIG. 6A to FIG. 6D are sectional schematic views of a manufacturing process of the light emitting component array substrate 10A according to another embodiment of the present disclosure. The manufacturing process of the light emitting component array substrate 10A are described using examples with respect to FIG. 6A to FIG. 6D as follows.

Figure 6A:
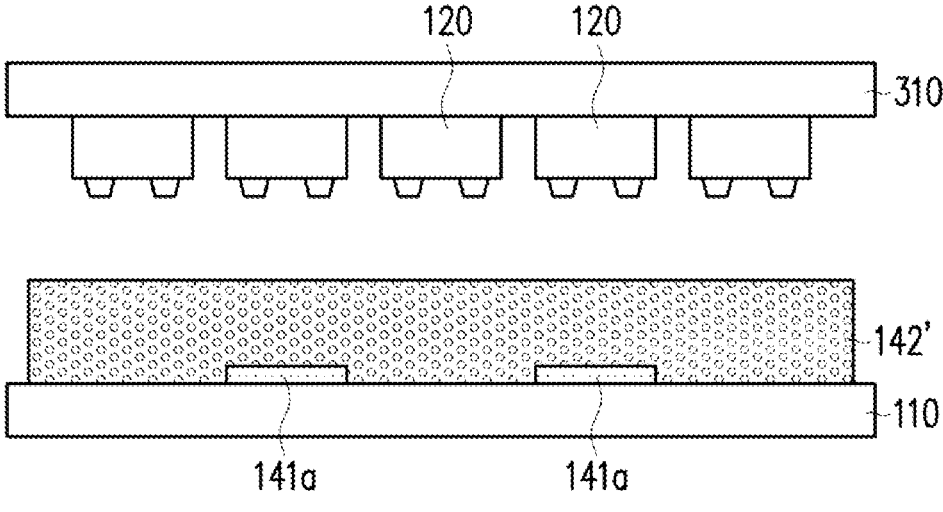
FIG. 6A to FIG. 6D are sectional schematic views of a manufacturing process of a light emitting component array substrate according to another embodiment of the present disclosure.

Referring to FIG. 6A, firstly, a growth substrate 310 and a plurality of light emitting components 120 formed on the growth substrate 310 are provided. Subsequently, a temporary storage substrate 110, a plurality of adhering patterns 141a on the temporary storage substrate 110 and an adhering layer 142' covering the adhering patterns 141a and the temporary storage substrate 110 are provided.

Figure 6B:
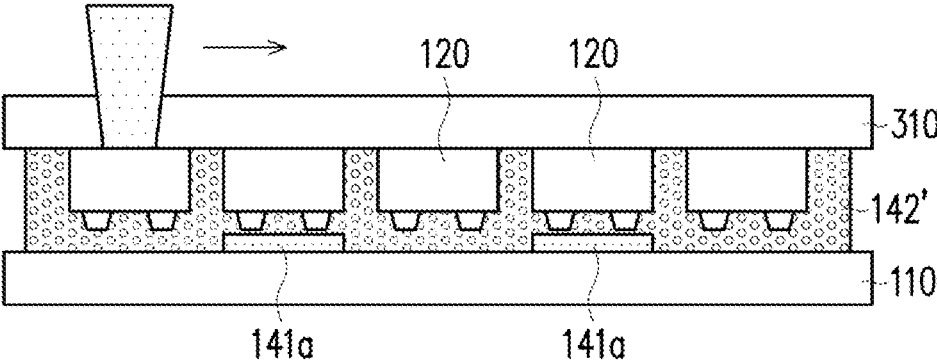

Referring to FIGS. 6A and 6B, subsequently, the light emitting components 120 on the growth substrate 310 are transposed to the adhering layer 142'. Some of the light emitting components 120 being transposed onto the adhering layer 142' overlap with the adhering layer 142' but are staggered to the adhering patterns 141a, and some others of the light emitting components 120 being transposed onto the adhering layer 142' overlap with the adhering layer 142' and the adhering patterns 141a. For example, in one embodiment, the growth substrate 310 and the light emitting components 120 may be detached using the laser lift-off (LLO) process, thereby transposing the light emitting components 120 onto the adhering layer 142', but the present disclosure is not limited thereto.

Figure 6C:
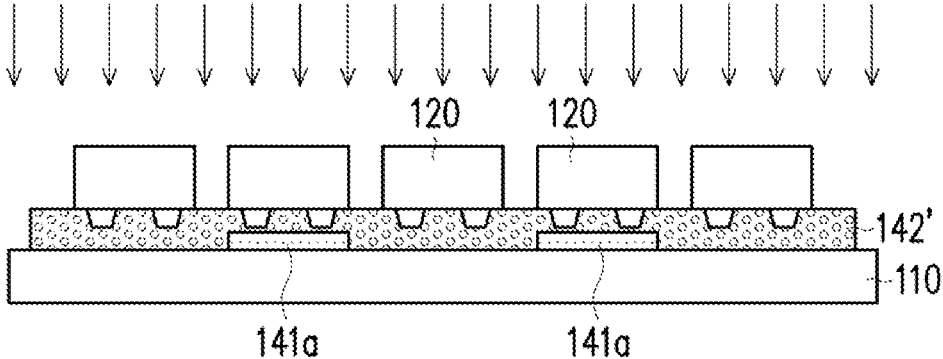
Figure 6D:
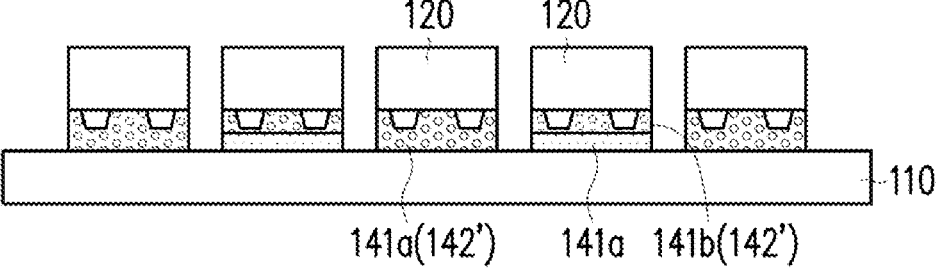

Referring to FIG. 6C and FIG. 6D, subsequently, the adhering layer 142' is etched using the light emitting components 120 as a hard mask. In the etching process, the portion of the adhering layer 142' covered by the light emitting components 120 and the adhering patterns 141a covered by the light emitting components 120 are retained, and the other portion of the adhering layer 142' not covered by the light emitting components 120 are removed. The retained portion of the adhering layer 142' form a plurality of adhering patterns 142a and a plurality of adhering patterns 142b respectively overlapping with the light emitting components 120. Each adhering pattern 142a is located between the temporary storage substrate 110 and a corresponding light emitting component 120, and two sides of each adhering pattern 142a are directly connected respectively to the temporary storage substrate 110 and the corresponding light emitting component 120. The adhering patterns 142a of FIG. 6D are the first adhering patterns 130 of FIG. 4. Referring to FIG. 6D, each adhering pattern 142b is located between the a corresponding adhering pattern 141a and a corresponding light emitting component 120. The adhering patterns 141a of FIG. 6D are the first portions 141 of the second adhering patterns 140A of FIG. 4, and the adhering patterns 141b of FIG. 6D are the second portions 142 of the second adhering patterns 140A of FIG. 4.

Figure 7:
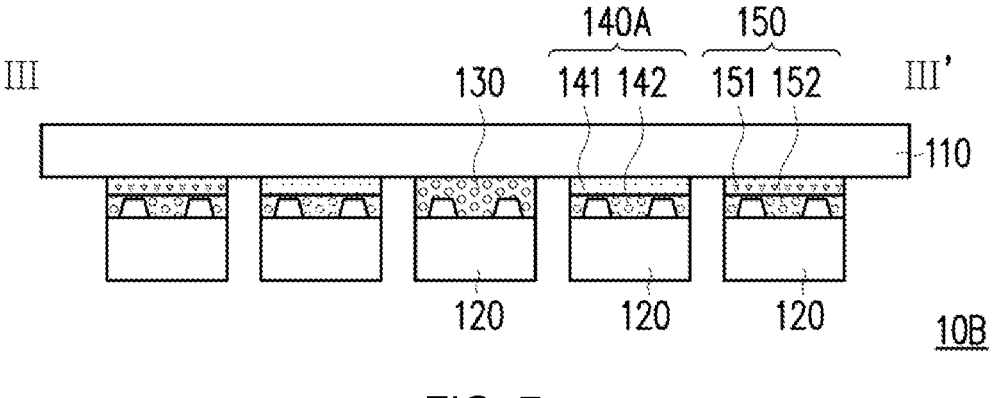
FIG. 7 is a sectional schematic view of a light emitting component array substrate according to a further embodiment of the present disclosure.
Figure 8:
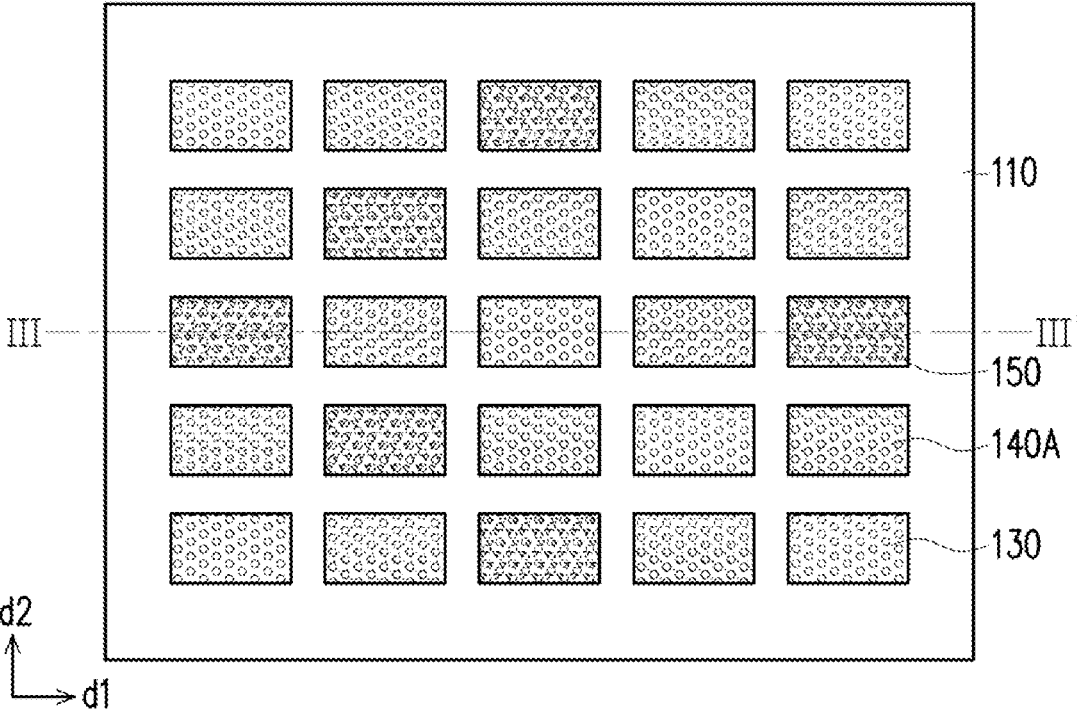
FIG. 8 is a top and perspective schematic view of a temporary storage substrate, a plurality of first adhering patterns, a plurality of second adhering patterns and a plurality of third adhering patterns according to a further embodiment of the present disclosure.

FIG. 7 is a sectional schematic view of a light emitting component array substrate according to a further embodiment of the present disclosure. FIG. 8 is a top and perspective schematic view of a temporary storage substrate, a plurality of first adhering patterns, a plurality of second adhering patterns and a plurality of third adhering patterns according to a further embodiment of the present disclosure. FIG. 7 corresponds to the sectional line III-III' of FIG. 8. Referring to FIG. 7 and FIG. 8, the light emitting component array substrate 10B in the present embodiment is similar to the aforementioned light emitting component array substrate 10A, and the difference between the two exists in that the light emitting component array substrate 10B in the present embodiment further includes a plurality of third adhering patterns 150.

Referring to FIG. 7 and FIG. 8, in the present embodiment, the first adhering patterns 130, the second adhering patterns 140A and the third adhering patterns 150 are respectively disposed on the light emitting components 120. The transmittance of each first adhering pattern 130 at the operating wavelength λ1 (referring to FIG. 3), the transmittance of at least one portion of each second adhering pattern 140A at the same operating wavelength λ1 and the transmittance of at least one portion of each third adhering pattern 150 at the same operating wavelength λ1 are different from each other.

In one embodiment, each third adhering pattern 150 may include a first portion 151 and a second portion 152, and the second portion 152 of each third adhering pattern 150 is located between the first portion 151 of each third adhering pattern 150 and a corresponding light emitting component 120. The transmittance of the first portion 151 of each third adhering pattern 150 at the operating wavelength λ1 (referring to FIG. 3) is different from the transmittance of the first adhering patterns 130 at the same operating wavelength λ1, and the material of the second portion 152 of each third adhering pattern 150 may be identical to the material of the first adhering patterns 130.

Figure 9:
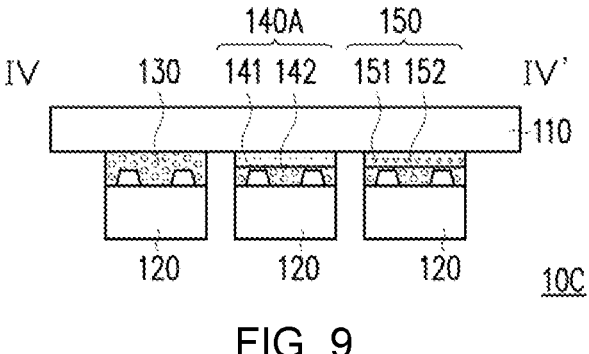
FIG. 9 is a sectional schematic view of a light emitting component array substrate according to yet another embodiment of the present disclosure.
Figure 10:
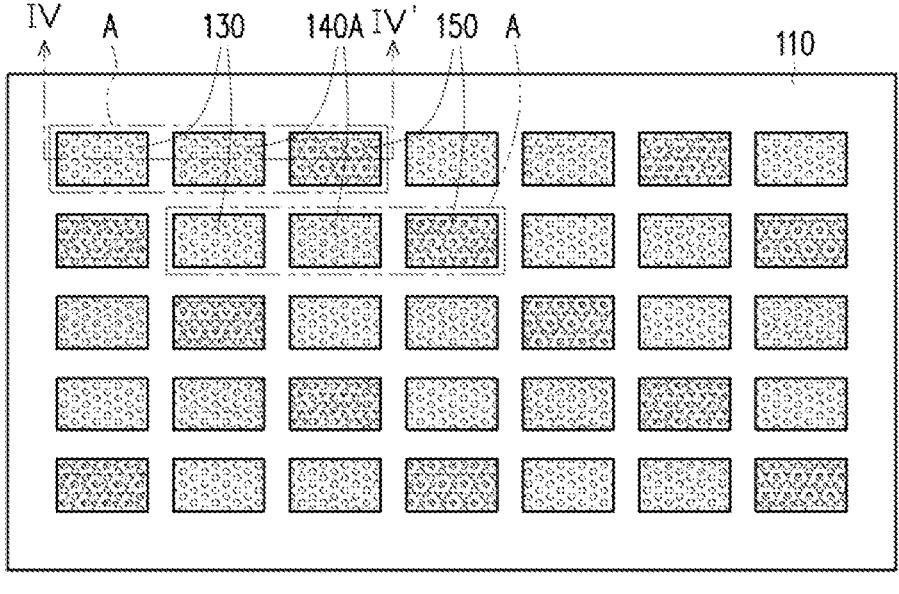
FIG. 10 is a top and perspective schematic view of a temporary storage substrate, a plurality of first adhering patterns, a plurality of second adhering patterns and a plurality of third adhering patterns according to yet another embodiment of the present disclosure.
Figure 10:

FIG. 9 is a sectional schematic view of a light emitting component array substrate according to yet another embodiment of the present disclosure. FIG. 10 is a top and perspective schematic view of a temporary storage substrate, a plurality of first adhering patterns, a plurality of second adhering patterns and a plurality of third adhering patterns according to yet another embodiment of the present disclosure. FIG. 9 corresponds to the sectional line IV-IV' of FIG. 10. The light emitting component array substrate 10C in the embodiment of FIG. 9 and FIG. 10 is similar to the light emitting component array substrate 10B in the embodiment of FIG. 7 and FIG. 8, and the difference between the two exists in that the arrangement of the first adhering patterns 130, the second adhering patterns 140A and the third adhering patterns 150 is different.

Referring to FIG. 9 and FIG. 10, specifically, in the present embodiment, the first adhering patterns 130, the second adhering patterns 140A and the third adhering patterns 150 are divided into a plurality of adhering pattern groups A. The first direction d1 intersects with the second direction d2. Each adhering pattern group A includes one of the first adhering patterns 130, one of the second adhering patterns 140A and one of the third adhering patterns 150 arranged sequentially in the first direction d1, and two adjacent adhering pattern groups A are arranged in the second direction d2. The first adhering patterns 130 of the two adjacent adhering pattern groups A are staggered from each other, the second adhering patterns 140A of the two adjacent adhering pattern groups A are staggered from each other, and the third adhering patterns 150 of the two adjacent adhering pattern groups A are staggered from each other.

Figure 11A:
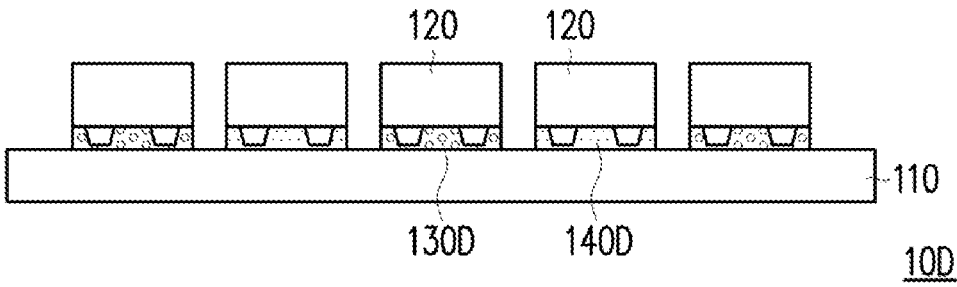
FIG. 11A is a sectional schematic view of a light emitting component array substrate according to one embodiment of the present disclosure.
Figure 11B:
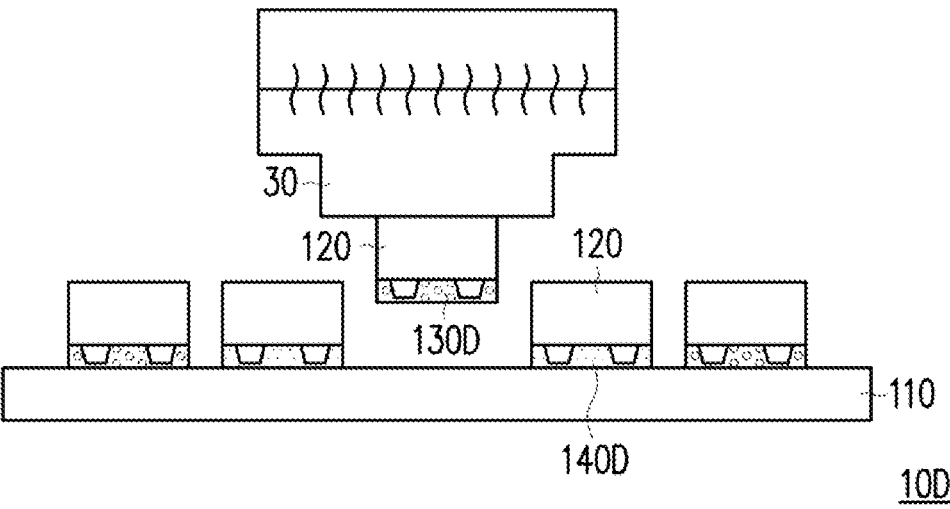
FIG. 11B shows a process of separating the temporary storage substrate from the light emitting components of the light emitting component array substrate according to one embodiment of the present disclosure.
Figure 12:
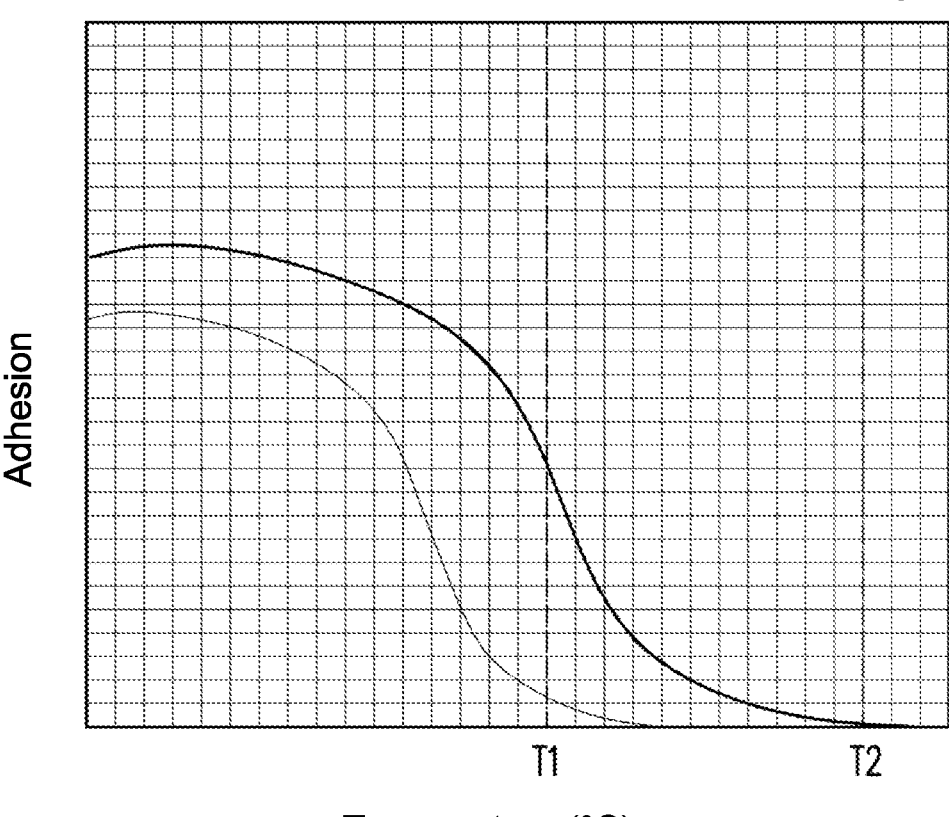
FIG. 12 shows the adhesions of the first adhering patterns and the second adhering patterns at each temperature according to one embodiment of the present disclosure.

FIG. 11A is a sectional schematic view of a light emitting component array substrate according to one embodiment of the present disclosure. FIG. 11B shows a process of separating the temporary storage substrate from the light emitting components of the light emitting component array substrate according to one embodiment of the present disclosure. FIG. 12 shows the adhesions of the first adhering patterns 130D and the second adhering patterns 140D at each temperature according to one embodiment of the present disclosure.

Referring to FIG. 11A, the light emitting array substrate 10 includes a temporary storage substrate 110, a plurality of light emitting components 120, a plurality of first adhering patterns 130D and a plurality of second adhering patterns 140D. The light emitting components 120 are disposed on the temporary storage substrate 110. The first adhering patterns 130D and the second adhering patterns 140D are respectively disposed on the light emitting components 120. In one embodiment, the first adhering patterns 130D and the second adhering patterns 140D may be located between the temporary storage substrate 110 and the light emitting components 120, and each light emitting component 120 may be temporarily fixed on the temporary storage substrate 110 by a corresponding first adhering pattern 130D or a corresponding second adhering pattern 140D.

Referring to FIG. 11A and FIG. 12, it should be noted that, in one embodiment, an adhesion of each first adhering pattern 130D at an operating temperature T1 is different from an adhesion of at least one portion of each second adhering pattern 140D at the operating temperature T1. For example, in one embodiment, the adhesion of each first adhering pattern 130D at an operating temperature T1 may be less than the adhesion of the at least one portion of each second adhering pattern 140D at the same operating temperature T1. In one embodiment, an absolute value of a difference between the adhesion of each first adhering pattern 130D at an operating temperature T1 and the adhesion of the at least one portion of each second adhering pattern 140D at the same operating temperature T1 is greater than or equal to 2 Newton (N).

Referring to FIG. 11A and FIG. 11B, subsequently, the light emitting components 120 are retrieved using a heat retrieval component 30 that may be heated. When the heat retrieval component 30 being heated to a temperature equivalent to the operating temperature T1 contacts the light emitting components 120 to be retrieved, the first adhering patterns 130D are heated and the adhesion thereof is significantly reduced, such that the heat retrieval component 30 may retrieve the light emitting components 120 overlapping with the first adhering patterns 130D.

It should be noted that, when retrieving the light emitting components 120 using the heat retrieval component 30, the adhesion of each first adhering pattern 130D at the operating temperature T1 is different from the adhesion of the at least one portion of each second adhering pattern 140D at the same operating temperature T1. Thus, when retrieving the light emitting components 120 using the heat retrieval component 30, even though the heat retrieval component 30 contacts the light emitting components 120 overlapping with the second adhering patterns 140, the light emitting components 120 overlapping with the second adhering patterns 140 are less likely being mistakenly retrieved by the heat retrieval component 30. Thus, when designing a gap G (referring to FIG. 11A) of the light emitting components 120 on the temporary substrate 110, the gap G may be properly reduced, thereby helping to reduce the cost.

Referring to FIG. 12, the operating temperature T1 is different from an operating temperature T2. Referring to FIG. 11B and FIG. 12, the adhesion of the second adhering patterns 140D at the operating temperature T2 is close to or equal to 0. In one embodiment, the operating temperature T2 may be greater than the operating temperature T1. In one embodiment, after completing the retrieval of the light emitting components 120 overlapping with the first adhering patterns 130D, the heat retrieval component 30 may be heated to a temperature (not illustrated) equivalent to the operating temperature T2, thereby completing the retrieval of the light emitting components 120 overlapping with the second adhering patterns 140D (not illustrated).

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light emitting component array substrate, comprising:
  a temporary storage substrate;
  a plurality of light emitting components, disposed on the temporary storage substrate; and a plurality of first adhering patterns and a plurality of second adhering patterns, respectively disposed on the light emitting components;
  wherein a transmittance of each of the first adhering patterns at an operating wavelength is different from a transmittance of at least one portion of each of the second adhering patterns at the operating wavelength; or
  wherein an adhesion of each of the first adhering patterns at an operating temperature is different from an adhesion of at least one portion of each of the second adhering patterns at the operating temperature.

2. The light emitting component array substrate according to claim 1, wherein the transmittance of each of the first adhering patterns at the operating wavelength is different from the transmittance of the at least one portion of each of the second adhering patterns at the operating wavelength, and an absolute value of a difference between the transmittance of each of the first adhering patterns at the operating wavelength and the transmittance of the at least one portion of each of the second adhering patterns at the operating wavelength is greater than or equal to 10%.

3. The light emitting component array substrate according to claim 1, wherein the adhesion of each of the first adhering patterns at the operating temperature is different from the adhesion of the at least one portion of each of the second adhering patterns at the operating temperature, and an absolute value of a difference between the adhesion of each of the first adhering patterns at the operating temperature and an adhesion of the at least one portion of each of the second adhering patterns at the operating temperature is greater than or equal to 2 N.

4. The light emitting component array substrate according to claim 1, wherein a first direction intersects with a second direction, and the first adhering patterns and the second adhering patterns are arranged alternately in the first direction and the second direction.

5. The light emitting component array substrate according to claim 1, wherein each of the second adhering patterns comprises:
  a first portion; and
  a second portion, located between the first portion of each of the second adhering patterns and a corresponding one of the light emitting components, wherein the at least one portion of each of the second adhering patterns is the first portion of each of the second adhering patterns, and a material of the second portion of each of the second adhering patterns is identical to a material of the first adhering patterns.

6. The light emitting component array substrate according to claim 1, further comprising:
  a plurality of third adhering patterns, wherein the first adhering patterns, the second adhering patterns and the third adhering patterns are respectively disposed on the light emitting components;
  wherein the transmittance of each of the first adhering patterns at the operating wavelength, the transmittance of the at least one portion of each of the second adhering patterns at the operating wavelength and a transmittance of at least one portion of each of the third adhering patterns at the operating wavelength are different from each other.

7. The light emitting component array substrate according to claim 6, wherein the first adhering patterns, the second adhering patterns and the third adhering patterns are divided into a plurality of adhering pattern groups, a first direction intersects with a second direction, each of the adhering pattern groups comprises one of the first adhering patterns, one of the second adhering patterns and one of the third adhering patterns arranged sequentially in the first direction, two adjacent ones of the adhering pattern groups are arranged in the second direction, and the first adhering patterns of the two adjacent ones of the adhering pattern groups are staggered from each other.

8. The light emitting component array substrate according to claim 6, wherein each of the second adhering patterns comprises:

a first portion; and a second portion, located between the first portion of each of the second adhering patterns and a corresponding one of the light emitting components, wherein the at least one portion of each of the second adhering patterns is the first portion of each of the second adhering patterns, and a material of the second portion of each of the second adhering patterns is identical to a material of the first adhering patterns.

9. The light emitting component array substrate according to claim 8, wherein each of the third adhering patterns comprises:

a first portion; and a second portion, located between the first portion of each of the third adhering patterns and a corresponding one of the light emitting components, wherein the at least one portion of each of the third adhering patterns is the first portion of each of the third adhering patterns, and a material of the second portion of each of the third adhering patterns is identical to the material of the first adhering patterns.

\* \* \* \* \*